United States Patent
Suzuki et al.

(10) Patent No.: US 8,597,429 B2
(45) Date of Patent: Dec. 3, 2013

(54) MANUFACTURING APPARATUS AND METHOD FOR SEMICONDUCTOR DEVICE

(75) Inventors: Kunihiko Suzuki, Shizuoka-ken (JP); Hironobu Hirata, Mishima (JP)

(73) Assignee: NuFlare Technology, Inc., Shizuoka-ken (JP)

( * ) Notice: Subject to any disclaimer, the term of this patent is extended or adjusted under 35 U.S.C. 154(b) by 117 days.

(21) Appl. No.: 13/350,102

(22) Filed: Jan. 13, 2012

(65) Prior Publication Data

US 2012/0184054 A1   Jul. 19, 2012

(30) Foreign Application Priority Data

Jan. 18, 2011   (JP) ................................. 2011-007736

(51) Int. Cl.
*C23C 16/00* (2006.01)
*H01L 21/31* (2006.01)

(52) U.S. Cl.
USPC ............ 118/715; 118/724; 118/730; 438/790

(58) Field of Classification Search
USPC .......... 118/715, 724, 725, 730; 438/789, 790, 438/793, 794
See application file for complete search history.

(56) References Cited

U.S. PATENT DOCUMENTS

| | | | |
|---|---|---|---|
| 5,173,336 A | 12/1992 | Kennedy | |
| 5,520,742 A | 5/1996 | Ohkase | |
| 5,605,867 A * | 2/1997 | Sato et al. ..................... | 438/790 |
| 5,972,116 A | 10/1999 | Takagi | |
| 6,059,885 A | 5/2000 | Ohashi et al. | |
| 6,113,705 A | 9/2000 | Ohashi et al. | |
| 6,752,872 B2 | 6/2004 | Inada et al. | |
| 6,869,641 B2 | 3/2005 | Schmitt | |
| 6,966,936 B2 * | 11/2005 | Yamasaki et al. ............ | 55/385.2 |
| 7,344,755 B2 * | 3/2008 | Beaman et al. ............ | 427/255.7 |
| 7,452,827 B2 | 11/2008 | Gianoulakis et al. | |
| 7,691,203 B2 | 4/2010 | Inagaki et al. | |
| 7,967,912 B2 | 6/2011 | Yajima et al. | |
| 2003/0037730 A1 * | 2/2003 | Yamasaki et al. ............ | 118/715 |
| 2004/0052972 A1 | 3/2004 | Schmitt | |
| 2006/0234514 A1 | 10/2006 | Gianoulakis et al. | |
| 2008/0251018 A1 * | 10/2008 | Moriya et al. ................ | 118/726 |
| 2009/0142933 A1 | 6/2009 | Yajima et al. | |
| 2009/0272323 A1 | 11/2009 | Ito | |
| 2012/0312235 A1 * | 12/2012 | Yamamoto ..................... | 118/725 |

FOREIGN PATENT DOCUMENTS

| | | |
|---|---|---|
| JP | 62-2525 | 1/1987 |
| JP | 9-289187 | 11/1997 |
| JP | 10-50615 | 2/1998 |
| JP | 10-112400 | 4/1998 |
| JP | 11-67675 | 3/1999 |
| JP | 2000-173925 | 6/2000 |
| JP | 2002-16008 | 1/2002 |
| JP | 2008-112919 | 5/2008 |

* cited by examiner (Continued)

*Primary Examiner* — Kevin M Picardat
(74) *Attorney, Agent, or Firm* — Finnegan, Henderson, Farabow, Garrett & Dunner, L.L.P.

(57) ABSTRACT

Provided is a semiconductor manufacturing apparatus including: a reaction chamber including a gas supply inlet and a gas exhaust outlet, and into which a wafer is to be introduced; a process gas supply mechanism that supplies process gas into the reaction chamber from the gas supply inlet of the reaction chamber; a wafer retaining member that is arranged in the reaction chamber and that retains the wafer; a heater that heats the wafer retained by the wafer retaining member to a predetermined temperature; a rotation drive control mechanism that rotates the wafer retaining member together with the wafer; a gas exhaustion mechanism that exhausts gas in the reaction chamber from the gas exhaust outlet of the reaction chamber; and a drain that is disposed at a bottom portion near a wall surface in the reaction chamber and that collects and discharges oily silane that drips from the wall surface.

17 Claims, 3 Drawing Sheets

MANUFACTURING APPARATUS AND METHOD FOR SEMICONDUCTOR DEVICE

CROSS-REFERENCE TO RELATED APPLICATION

This application is based upon and claims the benefit of priority from the prior Japanese Patent Application No. 2011-007736 filed on Jan. 18, 2011, the entire contents of which are incorporated herein by reference.

BACKGROUND

The present invention relates to a semiconductor manufacturing apparatus and a semiconductor manufacturing method used for performing deposition on a semiconductor wafer by using Si source gas, for example.

In an epitaxial growth apparatus for Si, for example, $H_2$ gas as carrier gas and $SiH_2Cl_2$ gas or $SiHCl_3$ gas as source gas are used, and gas in which the aforementioned are mixed is supplied as process gas to a reaction chamber. Then, a wafer temperature is made to be about 1100° C., and Si is grown epitaxially on a wafer by a hydrogen reduction reaction.

At this occasion, reaction by-products such as polysilicon deposited on members such as a susceptor inside the reaction chamber are removed. Due to this, a cleaning (etching process) using Chlorine gas such as HCl gas is performed periodically. At this time, a Si—H—Cl polymer is generated as the by-product in the reaction chamber, is cooled near a ventilation outlet, and is deposited as oily silane (reactive polysiloxane).

The oily silane deposited as aforementioned is usually removed upon a periodically performed maintenance of the reaction chamber so as to prevent a ventilation system from being clogged. However, upon an air ventilation, there is a problem that $H_2$ gas and HCl gas are generated by a surface reacting with water in the air.

Further, when the reaction chamber undergoes the air ventilation, although the oily silane has the surface reacting with the water in the air to generate $H_2$ gas and HCl gas, the surface solidifies by turning into $SiO_2$, and thereby further reaction can be suppressed. On a vertical surface, there is no problem because most of the deposited oily silane is solidified by turning into $SiO_2$.

However, when a certain amount of the oily silane is collected on a horizontal surface, unreacted oily silane in a lower layer of a solidified portion reacts vigorously upon exfoliating the oily silane. Due to this, there is a risk of ignition and explosion of the $H_2$ gas. This especially becomes a problem in a single wafer processing epitaxial growth apparatus, which frequency of the air ventilation is low and the oily silane is more likely to be collected.

Thus, considerations are given to removing the oily silane without performing the air ventilation either in a wet process or a dry process. However, since the reaction of the lower layer is suppressed in the oily silane when the surface thereof is oxidized, there is a need to repeatedly perform oxidation and surface removal, which is a problem which effects a throughput.

SUMMARY

According to an aspect of the present invention, there is provided a semiconductor manufacturing apparatus including: a reaction chamber including a gas supply inlet and a gas exhaust outlet, and into which a wafer is to be introduced; a process gas supply mechanism that supplies process gas into the reaction chamber from the gas supply inlet of the reaction chamber; a wafer retaining member that is arranged in the reaction chamber and that retains the wafer; a heater that is arranged in the reaction chamber and that heats the wafer retained by the wafer retaining member to a predetermined temperature; a rotation drive control mechanism that rotates the wafer retaining member together with the wafer; a gas exhaustion mechanism that exhausts gas in the reaction chamber from the gas exhaust outlet of the reaction chamber; and a drain that is disposed at a bottom portion near a wall surface in the reaction chamber and that collects and discharges oily silane that drips from the wall surface.

Further, according to an aspect of the present invention, there is provided a semiconductor manufacturing method including: introducing a wafer into a reaction chamber; heating the wafer to a predetermined temperature; depositing on the wafer by rotating the wafer and supplying process gas including Si source gas on the wafer; and exhausting excessive process gas and discharging oily silane that is generated during the depositing and dripped from a wall surface of the reaction chamber from a drain arranged on a bottom surface of the reaction chamber to outside.

DETAILED DESCRIPTION

Reference will now be made in detail to the present embodiment of the invention, an example of which is illustrated in the accompanying drawings.

(First Embodiment)

Figure 1:
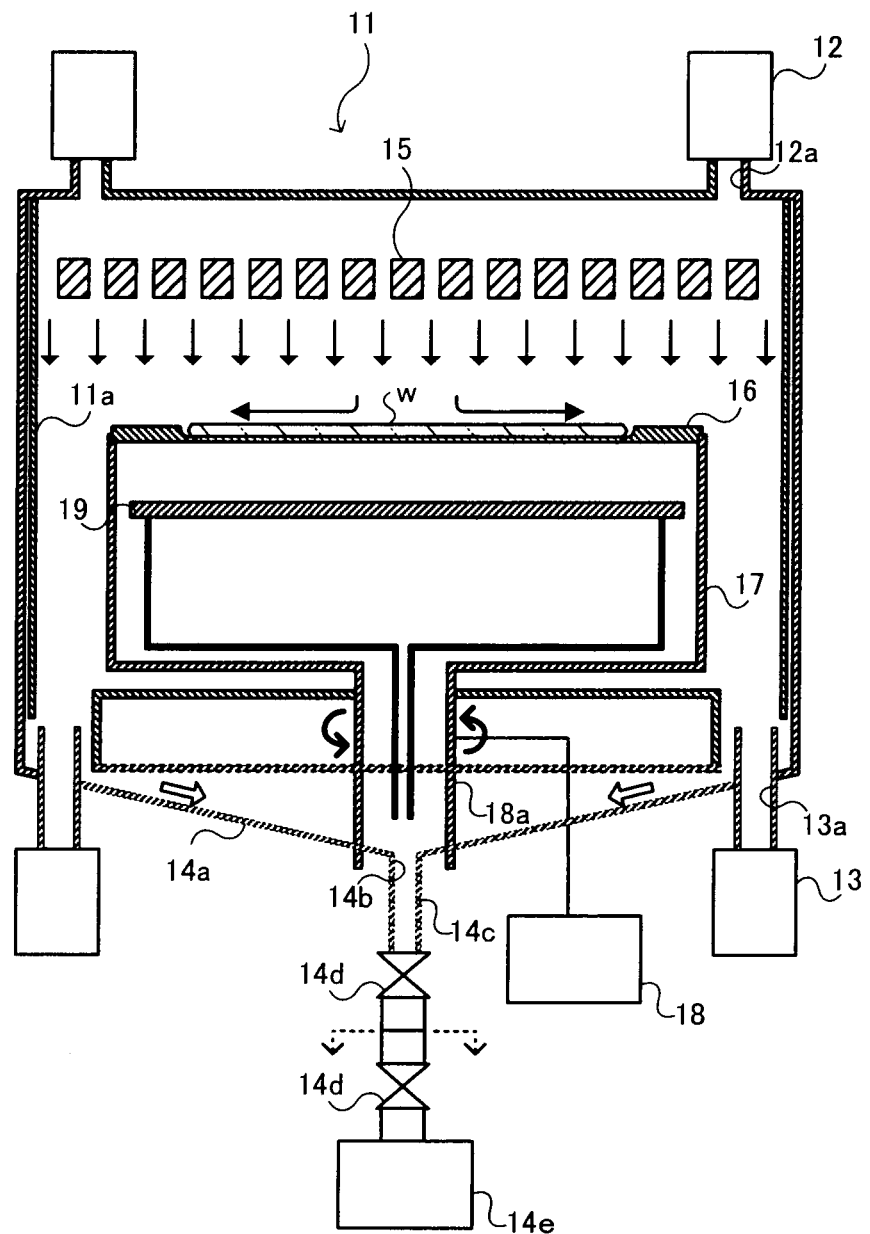
FIG. 1 is a cross sectional view showing a structure of an epitaxial deposition apparatus of a first embodiment.

FIG. 1 shows a cross sectional view of an epitaxial deposition apparatus as a semiconductor manufacturing apparatus in the present embodiment. As shown in the drawings, gas supply inlets 12a connected to a gas supply mechanism 12 configured to supply process gas containing source gas such as trichlorosilane, dichlorosilane and the like onto a wafer w at a predetermined flow rate from an upper portion of a reaction chamber 11 are arranged in the reaction chamber 11 in which the wafer w of, for example, ϕ200 mm undergoes a deposition step. On an inner wall of the reaction chamber 11, a liner 11a that is formed, for example, of quartz and that can be detached upon cleaning the reaction chamber 11 is provided. At, for example, two positions in a lower portion of the reaction chamber 11, there are provided gas exhaust outlets 13a connected to a gas exhaustion mechanism 13 configured to exhaust gas so as to control a pressure inside the reaction chamber 11 at a constant value (a normal pressure). At a bottom portion of the reaction chamber 11, an oily silane receiving section 14a is arranged as an oily silane guiding groove that receives and guides the oily silane dripped from the wall surface of the reaction chamber 11. Further, at a bottom surface of the oily silane receiving section 14a, an oily silane discharge outlet 14b configured to discharge the oily silane is formed. A drain 14c configured to discharge the oily silane to outside of the reaction chamber 11 is connected to the oily silane discharge outlet 14b. Further, under the drain 14c, a tank 14e configured to collect the oily silane is connected via valves 14d.

Figure 2A:
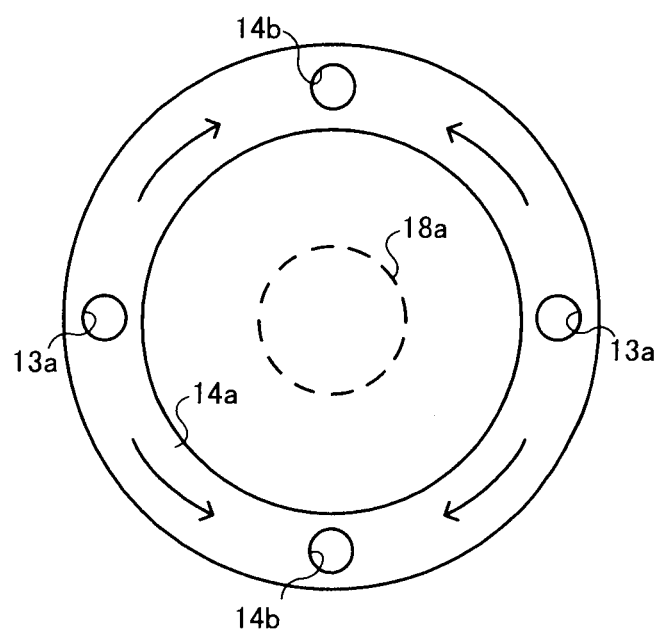
FIG. 2A is a top view showing an oily silane receiving section of the first embodiment.
Figure 2B:
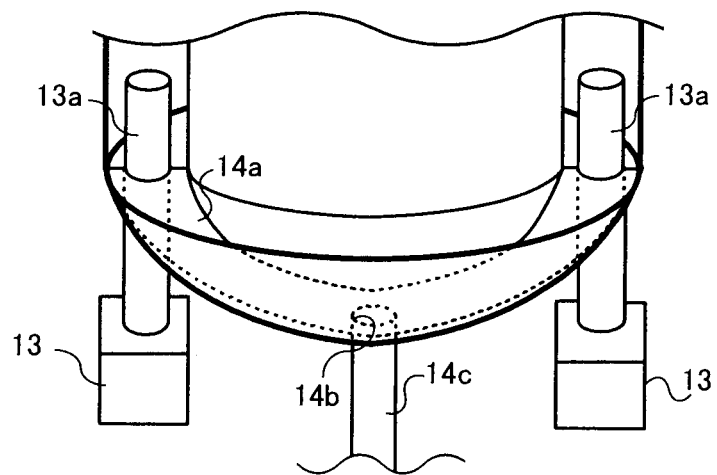
FIG. 2B is a perspective view showing the oily silane receiving section of the first embodiment.

FIG. 2A shows a top view of the oily silane receiving section 14a, and FIG. 2B shows a perspective view of the oily silane receiving section 14a, respectively. As shown in FIG. 2A, the oily silane receiving section 14a, which is a leading section configured to lead the oily silane to the outside of the reaction chamber 11 from an outer periphery portion of the gas exhaust outlets 13a, is formed around a rotation shaft 18a. This oily silane receiving section 14a is formed of a SUS (Steel Use Stainless) to which a mirror processing is performed, for example. Further, when seen from a top side, the gas exhaust outlets 13a and the oily silane discharge outlets 14b are arranged alternately at identical intervals on a same circumference on the oily silane receiving section 14a.

Further, as shown in FIG. 2B, the oily silane receiving section 14a has a taper angled from an apex portion toward a bottom portion so that the oily silane will not be collected in the oily silane receiving section 14a itself. Moreover, the gas exhaust outlets 13a are provided at a pair of apexes, and the oily silane discharge outlets 14b are provided at a pair of apexes on the oily silane receiving section 14a. Due to this, it has a mechanism in which the oily silane that has dripped from the wall surface to the oily silane receiving section 14a is led to a direction toward the bottom portion, and is discharged from the oily silane discharge outlets 14b provided at the lowest position (bottom portion). Note that, the oily silane discharge outlets 14b are provided on every bottom portion of the oily silane receiving section 14a. The number of the bottom portions can be changed voluntarily, for example, within one to four; and it is preferable to provide the number of the bottom portions to be two in the case where the number of the gas exhaust outlets 13a is two as shown in FIG. 2B.

Further, as shown in FIG. 2B, since opening portions of the two gas exhaust outlets 13a are positioned higher than the apex portion of the oily silane receiving section 14a, the oily silane that had dripped from the inner wall of the reaction chamber 11 onto the oily silane receiving section 14a does not intrude into the gas exhaust outlets 13a. Further, pipes connecting the gas exhaust outlets 13a and the gas exhaustion mechanism 13 extend below the outer periphery portion of the oily silane receiving section 14a.

Further, a detect ion mechanism (not shown) configured to detect an amount of the oily silane, a gas exhausting pump (not shown) and the like are arranged inside the tank 14e as needed.

At the upper portion of the reaction chamber 11, a rectifying plate 15 configured to supply the process gas provided from the gas supply inlets 12a onto the wafer w in a rectified state is arranged. Further, underneath thereof, a susceptor 16 as a retaining member configured to retain the wafer w is arranged on a ring 17 as a rotating member. Note that, the retaining member may be an annular holder. The ring 17 is connected to a rotation drive control mechanism 18 configured of the rotation shaft 18a that rotates the wafer w at a predetermined rotational speed, a motor (not shown) and the like.

A disc-shaped heater 19 configured, for example, of SiC so as to heat the wafer w is arranged inside the ring 17. Note that, a pattern may be formed on the heater 19 so that a uniform heating may be realized. As the heater 19, an annular heater for heating a peripheral portion of the wafer w may be used, and a reflector for heating effectively may be provided.

By using the epitaxial deposition apparatus configured as above, for example, an Si epitaxial film is formed on the wafer w of φ200 mm.

Firstly, the wafer w is conveyed into the reaction chamber 11, and the susceptor 16 onto which the wafer w is mounted is mounted on the ring 17. Then, a temperature of the heater 19 is controlled, for example, to be at 1500 to 1600° C. so that an in-plane temperature of the wafer w is uniformly retained at 1100° C.

Then, the wafer w is rotated, for example, at 900 rpm by the rotation drive control mechanism 18, and the process gas is supplied onto the wafer w from the gas supply mechanism 12 via the gas supply inlets 12a in the rectified state via the rectifying plate 15. The process gas is diluted with diluent gas such as $H_2$ so that a concentration of dichlorosilane is adjusted, for example, to 2.5%, and is supplied, for example, at 50 SLM.

Gases such as excessive dichlorosilane, process gas containing diluent gas, and HCl that is a by-product are exhausted downward from an outer periphery of the susceptor 16. Further, these gases are exhausted from the gas exhaustion mechanism 13 via the gas exhaust outlets 13a, and the pressure inside of the reaction chamber 11 is controlled at a constant value (for example, the normal pressure). In this manner, the Si epitaxial film is grown on the wafer w.

At this time, though oily silane generated from gases such as the excessive process gas is deposited in a gap between the quartz liner 11a near the gas exhaust outlet 13a and the inner wall of the quartz liner 11a as well as the inner wall of the quartz liner 11a, it is dripped to the oily silane receiving section 14a arranged at the outer periphery portion of the gas exhaust outlet 13a, and is collected in the tank 14e through the oily silane discharge outlet 14b, the drain 14c, and the valve 14d.

Then, when the detection mechanism (not shown) detects that a predetermined amount of the oily silane is collected in the tank 14e, the valve 14d is closed and the tank 14e is detached from a coupling joint. Then, the oily silane is processed in a safe environment such as inside a draft. At this time, it is possible to recycle by collecting generated gases such as $H_2$ and HCl.

Note that, upon an maintenance of the reaction chamber 11, the oily silane deposited on the wall surface and the like of the reaction chamber 11 mostly solidifies by turning into $SiO_2$ upon the air ventilation, but in order to further improve safety, it is preferable to supply $O_2$ gas in advance, thereby forming $SiO_2$ and then ventilate air. Solidified $SiO_2$ is removed together with other deposits (by-product).

According to the present embodiment, by providing the drain 14c discharging the oily silane and the tank 14e storing the discharged oily silane at outside the reaction chamber 11 and processing by detaching the tank 14e from the reaction chamber 11, a safe removal of the oily silane is enabled without decreasing a throughput.

(Second Embodiment)

In the present embodiment, the configuration of the epitaxial deposition apparatus is similar to the first embodiment; however, it differs from the first embodiment in that a plurality of oily silane receiving sections is provided around the rotation shaft 18a by configuring a gas exhaustion in a lateral direction.

Figure 3:
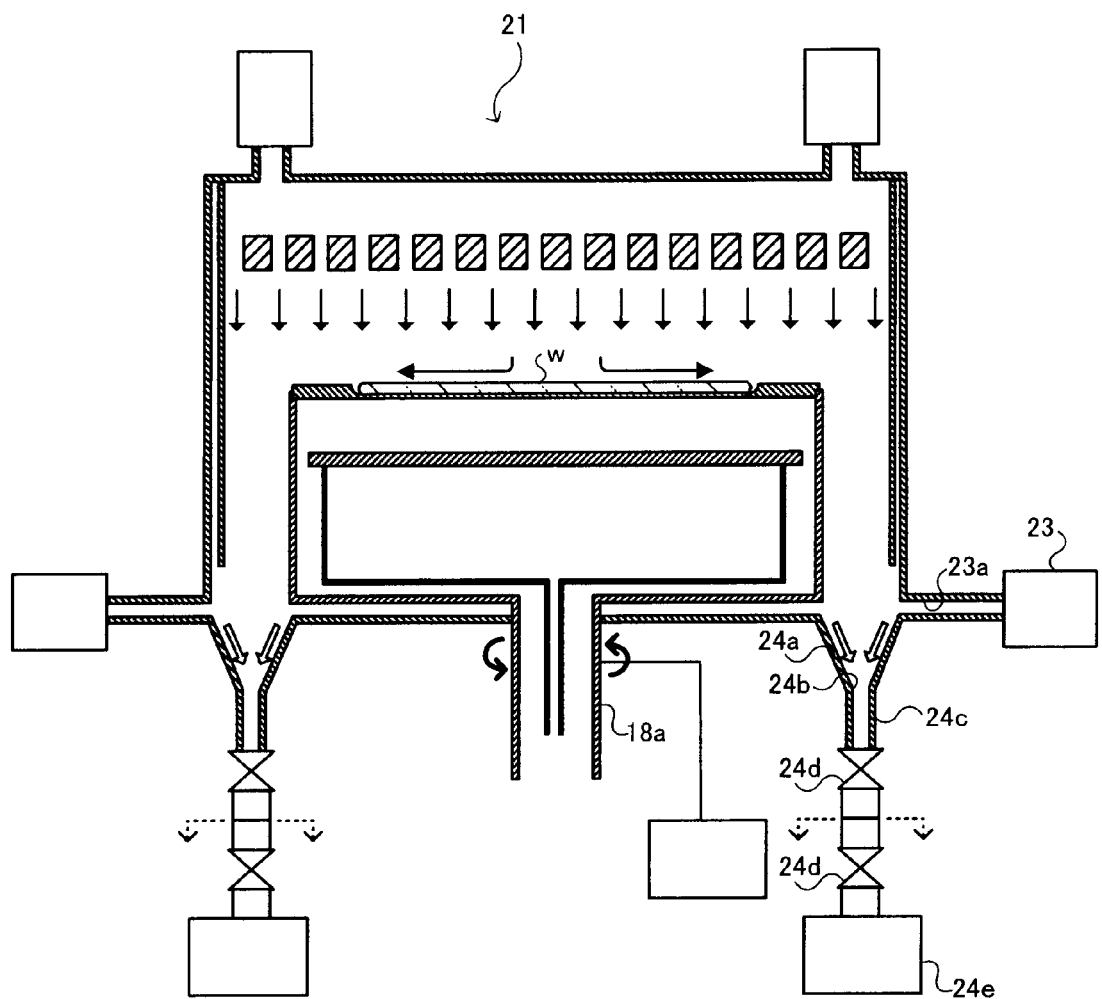
FIG. 3 is a cross sectional view showing a structure of an epitaxial deposition apparatus of a second embodiment.
Figure 4:
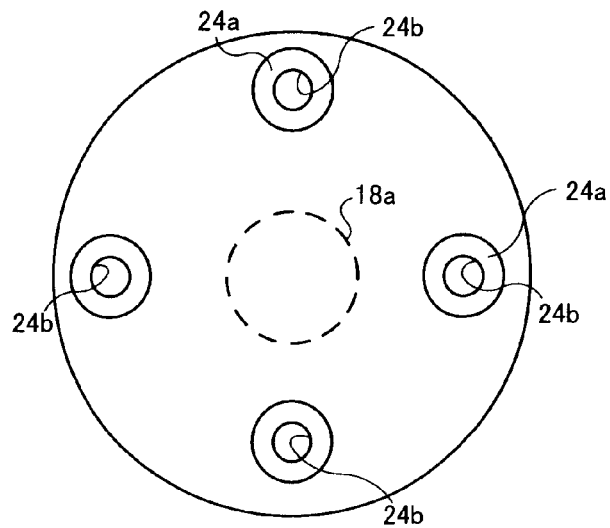
FIG. 4 is a top view showing an oily silane receiving section of the second embodiment.

FIG. 3 shows a cross sectional view of the epitaxial deposition apparatus as the semiconductor manufacturing apparatus in the present embodiment. The configuration is similar to the first embodiment, however, a gas exhaust outlet 23a connected via a pipe with a gas exhaustion mechanism 23 is arranged on a lower wall surface of a reaction chamber 21, and at a bottom surface of the reaction chamber 21, oily silane receiving sections 24a are provided. Further, at lower ends of the oily silane receiving sections 24a, oily silane discharge outlets 24b configured to discharge the oily silane are formed. Drains 24c configured to discharge the oily silane to outside of the reaction chamber 21 are connected to the oily silane discharge outlets 24b. Further, under the drains 24c, tanks 24e configured to collect the oily silane are connected via valves 24d.

Note that, the oily silane receiving sections 24a preferably have a taper shape in which a diameter of the oily silane discharge outlets 24b is smaller than a diameter of opened portions on the bottom surface side of the reaction chamber 21 so that the oily silane will not be collected therein.

By using the epitaxial deposition apparatus configured as above, similar to the first embodiment, for example, an Si epitaxial film is formed on the wafer w of φ200 mm. Then, similar to the first embodiment, the oily silane generated upon the deposition and deposited is collected in the tanks 24e via the oily silane receiving sections 24a, the oily silane discharge outlets 24b, the drains 24c, and the valves 24d, thereafter is processed similar to the first embodiment, and a similar maintenance is performed.

According to the present embodiment, similar to the first embodiment, by providing the drains 24c discharging the oily silane and the tanks 24e storing the discharged oily silane at outside the reaction chamber 21 and processing by detaching the tanks 24e from the reaction chamber 21, a safe removal of the oily silane is enabled without decreasing a throughput.

According to the present embodiment, it becomes possible to perform maintenance safely on the semiconductor manufacturing apparatus that forms high quality films such as an epitaxial film on a semiconductor wafer. Further, even with improved safety, throughput is not decreased. Due to this, in a semiconductor device that is formed by going through an element forming step and a partition step, high productivity can be obtained.

Especially, it can be used ideally as an epitaxial deposition apparatus configured to form a power semiconductor device such as a power MOSFET, IGBT and the like, which requires growing a thick film of 40 μm or more in an N-type base region, a P-type base region, an isolating region and the like.

Further, in these embodiments, the case of forming an Si monocrystal layer (epitaxial film) has been explained, however, the present embodiments can be adapted to forming a poly-Si layer. Further, it can also be adapted to deposition, for example, an $SiO_2$ film, an $Si_3N_4$ film and the like other than the Si film, and also to a GaAs layer and a compound semiconductor, for example, a GaAlAs, an InGaAs and the like.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor manufacturing apparatus comprising:
   a reaction chamber including a gas supply inlet and a gas exhaust outlet, and into which a wafer is to be introduced;
   a process gas supply mechanism that supplies process gas into the reaction chamber from the gas supply inlet of the reaction chamber;
   a wafer retaining member that is arranged in the reaction chamber and that retains the wafer;
   a heater that is arranged in the reaction chamber and that heats the wafer retained by the wafer retaining member to a predetermined temperature;
   a rotation drive control mechanism that rotates the wafer retaining member together with the wafer;
   a gas exhaustion mechanism that exhausts gas in the reaction chamber from the gas exhaust outlet of the reaction chamber; and
   a drain that is disposed at a bottom portion near a wall surface in the reaction chamber and that collects and discharges oily silane that drips from the wall surface.

2. The semiconductor manufacturing apparatus according to claim 1, further comprising an oily silane receiving section that leads the oily silane to the drain at a joint portion of a bottom surface of the reaction chamber and the drain.

3. The semiconductor manufacturing apparatus according to claim 2, wherein
   the gas exhaust outlet is disposed protruding from an upper surface of the oily silane receiving section, and
   the oily silane receiving section includes a guiding groove that is formed along an inner wall surface of the reaction chamber, has an apex portion near the gas exhaust outlet, is inclined downward from the apex portion toward the bottom portion to which the drain is arranged, and guides the oily silane dripped from the wall surface of the reaction chamber to the drain.

4. The semiconductor manufacturing apparatus according to claim 3, wherein the oily silane receiving section includes a plurality of the bottom portions, and the drain is connected to each bottom portion.

5. The semiconductor manufacturing apparatus according to claim 4, further comprising a tank that is connected to the drain, and capable of being detached from the reaction chamber in a state of having the oily silane collected.

6. The semiconductor manufacturing apparatus according to claim 5, further comprising a detection mechanism that detects an amount of the oily silane collected inside the tank.

7. The semiconductor manufacturing apparatus according to claim 6, wherein the oily silane receiving section is configured of a SUS to which a mirror processing is performed.

8. The semiconductor manufacturing apparatus according to claim 7, further comprising a liner that covers an inner wall of the reaction chamber.

9. The semiconductor manufacturing apparatus according to claim 8, wherein the liner is configured of quartz.

10. The semiconductor manufacturing apparatus according to claim 9, wherein the process gas includes source gas and carrier gas.

11. The semiconductor manufacturing apparatus according to claim 2, wherein
    the gas exhaust outlet is disposed at a lower portion of the wall surface of the reaction chamber, and
    a plurality of the oily silane receiving sections is formed on the bottom surface of the reaction chamber, which diameter on the drain side of the reaction chamber is smaller than a diameter thereof on the bottom surface side.

12. The semiconductor manufacturing apparatus according to claim 11, further comprising a tank that is connected to the drain, and capable of being detached from the reaction chamber in a state of having the oily silane collected.

13. The semiconductor manufacturing apparatus according to claim 12, further comprising a detection mechanism that detects an amount of the oily silane collected inside the tank.

14. The semiconductor manufacturing apparatus according to claim 13, wherein the oily silane receiving section is configured of a SUS to which a mirror processing is performed.

15. The semiconductor manufacturing apparatus according to claim 14, further comprising a liner that covers an inner wall of the reaction chamber.

16. The semiconductor manufacturing apparatus according to claim 15, wherein the liner is configured of quartz.

17. The semiconductor manufacturing apparatus according to claim 16, wherein the process gas includes source gas and carrier gas.

* * * * *